United States Patent
Evans et al.

(10) Patent No.: US 8,952,736 B1
(45) Date of Patent: Feb. 10, 2015

(54) METHOD AND SYSTEM FOR QUANTIZATION-FREE AND PHASE-DITHERED FRACTIONAL-N GENERATION FOR PHASE-LOCKED-LOOPS

(71) Applicant: NVIDIA Corporation, Santa Clara, CA (US)

(72) Inventors: Ken Evans, San Jose, CA (US); Bhupendra Ahuja, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/050,209

(22) Filed: Oct. 9, 2013

(51) Int. Cl.
 *H03L 7/197* (2006.01)
 *H03L 7/08* (2006.01)

(52) U.S. Cl.
 CPC ............... *H03L 7/08* (2013.01); *H03L 7/1974* (2013.01)
 USPC .............. 327/156; 327/147; 331/17; 375/376

(58) Field of Classification Search
 CPC .............. H03L 7/08; H03L 7/16; H03L 7/18; H03L 7/197; H03L 7/1974; H03L 7/1976
 USPC ................... 327/147, 150, 156, 159; 331/17; 375/373, 376
 See application file for complete search history.

(56) References Cited

U.S. PATENT DOCUMENTS

| | | | |
|---|---|---|---|
| 7,162,002 B2 * | 1/2007 | Chen et al. | 375/376 |
| 7,486,145 B2 * | 2/2009 | Floyd et al. | 331/1 A |
| 7,605,665 B2 * | 10/2009 | Chambers et al. | 331/16 |
| 7,737,791 B2 * | 6/2010 | Sareen et al. | 331/1 A |
| 7,881,419 B2 * | 2/2011 | Shin | 375/376 |
| 2003/0198311 A1 | 10/2003 | Song et al. | |

OTHER PUBLICATIONS

Galton, Delta-Sigma Fractional-N Phase-Locked Loops, Phase-Locking in High-Performance Systems: From Devices to Architectures; Published Feb. 27, 2003.

Hanumolu et al., A Sub-Picosecond Resolution 0.5-1.5 GHz Digital-to-Phase Converter, IEEE Journal of Solid-State Circuits, Feb. 2008, p. 414-424, vol. 43, No. 2.

Yin, et al., A 0.7-to-3.5 GHz 0.6-to-2.8 mW Highly Digital Phase-Locked Loop With Bandwidth Tracking, IEEE Journal of Solid-State Circuits, Aug. 2011, p. 1870-1880, vol. 46, No. 8.

* cited by examiner

*Primary Examiner* — Patrick O'Neill

(57) ABSTRACT

A phased lock loop (PLL) including a retimer unit, rotator unit, and clock selection unit. The retimer unit is configured for sampling a divided clock generated by a divide-by-N unit with a plurality of phases of an oscillator clock generated by a ring oscillator to generate a plurality of phase shifted divide-by-N clocks. The rotator unit is configured for selectively rotating through the plurality of phase shifted divide-by-N clocks based on a constant phase shift interval, wherein the rotator unit controls a clock selection unit to produce a single output phase selected from a plurality of generated divide-by-N clock phases.

20 Claims, 14 Drawing Sheets

METHOD AND SYSTEM FOR QUANTIZATION-FREE AND PHASE-DITHERED FRACTIONAL-N GENERATION FOR PHASE-LOCKED-LOOPS

BACKGROUND

Phase-locked loops (PLLs) operate primarily as clock frequency multipliers, and the output clock is generated by multiplying an input clock frequency by an integer divider value, "N". Fractional-N values can be used as well.

A common prior art implementation of fractional N values is to dynamically adjust the integer value of N so that the time-average value of N contains both an integer and a fractional component. However, the dynamic adjustment causes instantaneous phase errors within the PLL that must be constantly corrected. These phase errors result in what is commonly referred to as "fractional-N spurs," which are undesired spectral degradation of the PLL output clock. Delta-sigma modulation (DSM) techniques are used to suppress the magnitude of fractional-N spurs embedded in the clock, but there is a limit to the extent this impurity can be filtered out.

PRIOR ART FIG. 1A is a block diagram of a traditional PLL 100A. Upon startup of the PLL 100A, the voltage-controlled ring oscillator (VCO) 140 produces a clock in K phases that exhibits an arbitrary "free-running" frequency of value $F_{VCO}$. One of the K phases of the clock is given to the integer-based divide-by-N unit 150, and a clock with frequency $F_{VCO}/N$, with N=NDIV_INT being a positive integer is generated. The divide-by-N clock exhibits a pulse with a logical value 1 of width $T_{VCO}$, where $T_{VCO}=1/F_{VCO}$. The remainder of the clock cycle is logical 0, with duration $(N-1)\times T_{VCO}$. This divided clock is labeled as the feedback clock.

The phase detector 110 will compare the phase difference between the reference clock and the feedback clock, and generate an error pulse of width equal to the phase difference. The phase difference is converted to electrical current by the charge pump 120, and the current is terminated in the loop filter 130 to produce an updated control voltage to the VCO 140.

On every cycle of the reference clock, the phase detector will generate a new error pulse that is processed by the charge pump and loop filter to update the voltage that controls the VCO 140. As (1) the frequency of the VCO clock approaches $N\times F_{ref}$, with $F_{ref}$ being the frequency of the reference clock, and (2) the phase difference between the reference clock and the feedback clock approaches zero, the width of the error pulse produced by the phase detector will approach zero.

A PLL 100A that is in the process of achieving frequency and phase lock is considered to be in a state of "acquisition." If the phase detector 110 produces a "negligible" error pulse, the PLL 100A is considered to have completed acquisition, and is in a state of "tracking" During the tracking state, the PLL 100A continues to refresh the error signal (even if it is zero value), so that the PLL 100A corrects minor deviations of phase and frequency from its lock point every update cycle of the reference clock.

A PLL 100A whose divide-by-N value remains static during operation is termed an "integer-N PLL." A PLL 100A whose divide-by-N value is dynamically adjusted every cycle of the feedback clock will exhibit an effective divide-by-N value, $N_{eff}$, whose time-average value consists of an integer and a fractional component. Such a PLL is termed a "fractional-N PLL." For example, if the divided-by-N value alternates between values N and N+1 for every cycle of the feedback clock, the time average value of $N_{eff}$ will be N+½.

A general fractional-N PLL can exhibit dynamic divide values ranging from N−L to N+L, with L being a positive integer such that L<N. For example, if L=3, the possible dynamic values of the divide-by-N unit are N+{−3,−2,−1,0,+1,+2,+3}. Irrespective of the value of L, the divide-by-N value will be adjusted every cycle of the feedback clock by a integer value. Each time the value is updated, the phase difference at the input of the phase detector will have a minimum value of $T_{VCO}$, which means the width of the error pulse will also be a minimum of $T_{VCO}$.

The constant generation of new phase error every cycle of the feedback clock introduces "spurs" into the spectral content of the VCO clock.

Random scrambling (with normal statistical distribution) of the divide-by-N value, with a time-average bias at $N_{eff}$, causes the phase error to be a phase-domain "white" noise process over time. In the frequency domain, the energy of a white noise process is uniformly distributed over all frequencies.

From the standpoint of either the reference clock or feedback clock, the frequency response of the PLL to the VCO clock appears as a phase-domain low-pass filter. If the divide-by-N value is randomly scrambled, the high-frequency power of the error signal will be attenuated while the low-frequency power is preserved. Consequently, the spur energy of the fractional-N PLL is caused by the preservation of this low-frequency power.

In lieu of random scrambling, a delta-sigma modulator (DSM) 160 is most often employed to scramble the divide-by-N value, while preserving the time-average bias at $N_{eff}$. A DSM is a non-linear digital filter that partially removes low-frequency energy and relocates it to higher frequencies. The total energy across frequencies remains the same, but the distribution of power is weighted towards high frequencies. Use of a DSM 160 for fractional-N synthesis lowers overall spur energy by reducing in-band error signal energy at the output of the phase detector.

PRIOR ART FIG. 1B is a block diagram of an alternative PLL 100B implementation that seeks to reduce the spur energy of PLL 100A by employing a multi-phase, multi-modulus divider instead of the single-phase divider of PLL 100A. The plurality of VCO phases are used to sample the divider output with flip-flop circuits, resulting in a plurality of divided clock phases with phase spacings identical to the plurality of VCO phases.

A combination of prescaler divider (divide by P/P+1) 170, divide-by-M counter 173, and divide-by-A counter 175 constitute the multi-modulus divider, with a combined divide value of (P×M+A). The plurality of divided clock phases, each with period $T_{VCO}\times(P\times M+A)$, is presented to the input of a clock selection unit (MUX) 177, and the output of the MUX 177 is arranged as the feedback branch of the PLL 100B that connects to the input of the phase detector 180.

A controller 182 provides dynamic values of P, M, and A, as well as a phase control value that selects one of the plurality of divided clock phases to be passed through to the output of the clock selection unit 177. The controller 182 produces such signals such that a desired "clock-wise" rotation of phase selection through the MUX 177 is sustained and produces a fractional component to the total multi-modulus divide value. The controller 182 will also produce a dynamic change in prescaler value to ensure the fractional component does not disappear when the final phase of divided clock is replaced by the first phase of divided clock at the output of the clock selection unit 177. A generic modulator is claimed to enhance fractional resolution by scrambling the input of the controller over time.

While the general strategy of multi-phase clock division is sound, PLL 100B restricts the divider implementation to an arrangement of a pre-scaler and two counters, M and A. This arrangement is specific for PLLs used in some types of wireless radio applications, but does not satisfy implementation for a general class of PLLs with a simple counter divider implementation, whose divide value is a simple integer value N, rather than (P×M+A).

Further, the arrangement of the prior-art retimer circuit 184 has the divided clock sampled (retimed) by the rising edge of the clock that produces the divided clock. This arrangement is prone to produce setup violations in the sampling operation, so a more robust retimer that retains plenty of setup and hold time margins is desirable. Also, PLL 100B implements a fractional generation controller 182 that only allows for positive fractional divider values, implemented by rotating the selection of the plurality of divided clock phases through the clock selection unit (MUX) in a clock-wise sequence. This is problematic for generation of very low-value fractional divide values close to zero. Moreover, the implementation of the multi-modulus divider (including the combination of prescaler divider [divide by P/P+1] 170, divide-by-M counter 173, and divide-by-A counter 175) of PLL 100B requires a range extension control to preserve uniform fractional divide value resolution over a large range.

SUMMARY

In embodiments of the present invention, a phase locked loop (PLL) system is described. In particular, the PLL is configured for quantization-free sub-integer generation, and includes a retimer unit, rotator unit, and clock selection unit. The retimer unit is configured for sampling a divided clock generated by a divide-by-N unit with a plurality of phases of an oscillator clock generated by a ring oscillator to generate a plurality of phase shifted divide-by-N clocks. The rotator unit is configured for selectively rotating through the plurality of phase shifted divide-by-N clocks based on a constant phase shift interval. The rotator unit controls the clock selection unit to produce a single output phase selected from the plurality of generated divide-by-N clock phases. The rotator unit is programmed to generate a static rate of change of phase selection, with the number of programming values, and hence the rate of change of phase as well, having a finite range of possible values.

In other embodiments of the present invention, another PLL system is described that is configured for phase-dithered fractional-N generation. The PLL includes a retimer unit, rotator unit, delta sigma modulator (DSM), and clock selection unit. The retime circuit is configured for sampling a divided clock generated by a divide-by-N unit with a plurality of phases of an oscillator clock generated by a ring oscillator to generate a plurality of phase shifted divide-by-N clocks. The rotator unit controls the clock selection unit to produce a single output phase selected from the plurality of generated divide-by-N clock phases. The rotator unit is dynamically programmed by a time-varying sequence of control values produced by the DSM, which results in a time-varying rate of change of phase selection, with the number of programming values, and hence the rate of change of phase as well, having a finite range of possible values. The desired time-average value of the rate of change of phase selection is statically programmed at the input of the DSM with appropriate resolution supported by the DSM.

In still other embodiments, a method for performing phase locking is described. The method includes receiving a plurality of phases of an oscillator clock generated by a ring oscillator. The method includes sampling a divided clock generated by a divide-by-N unit with the plurality of phases to generate a plurality of phase shifted divide-by-N clocks. The method further includes the generation of a single clock by rotated selection of the plurality of phase-shifted divide-by-N clocks by the rotator unit.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

PRIOR ART

PRIOR ART

PRIOR ART 3C depicts a block diagram of a retimer unit used in traditional PLLs.

Figure 4:
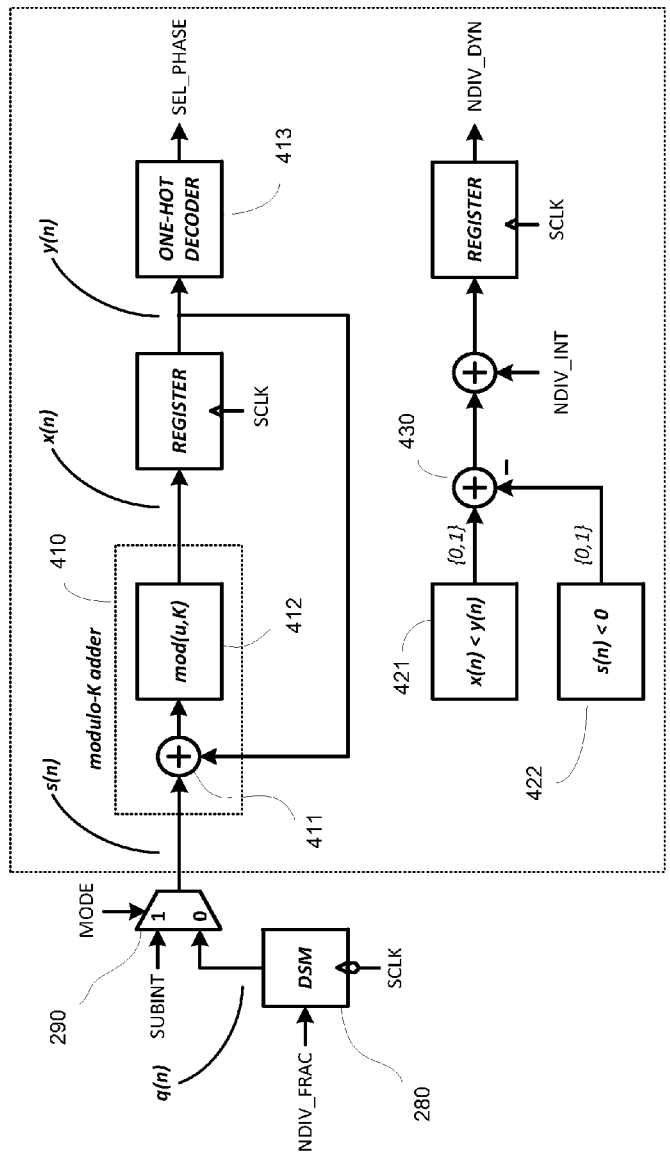

FIG. 4 depicts a block diagram of a rotator unit configured for selecting a proper output for the MUX selection unit providing a feedback clock signal, in accordance with one embodiment of the present disclosure.

Figure 5A:
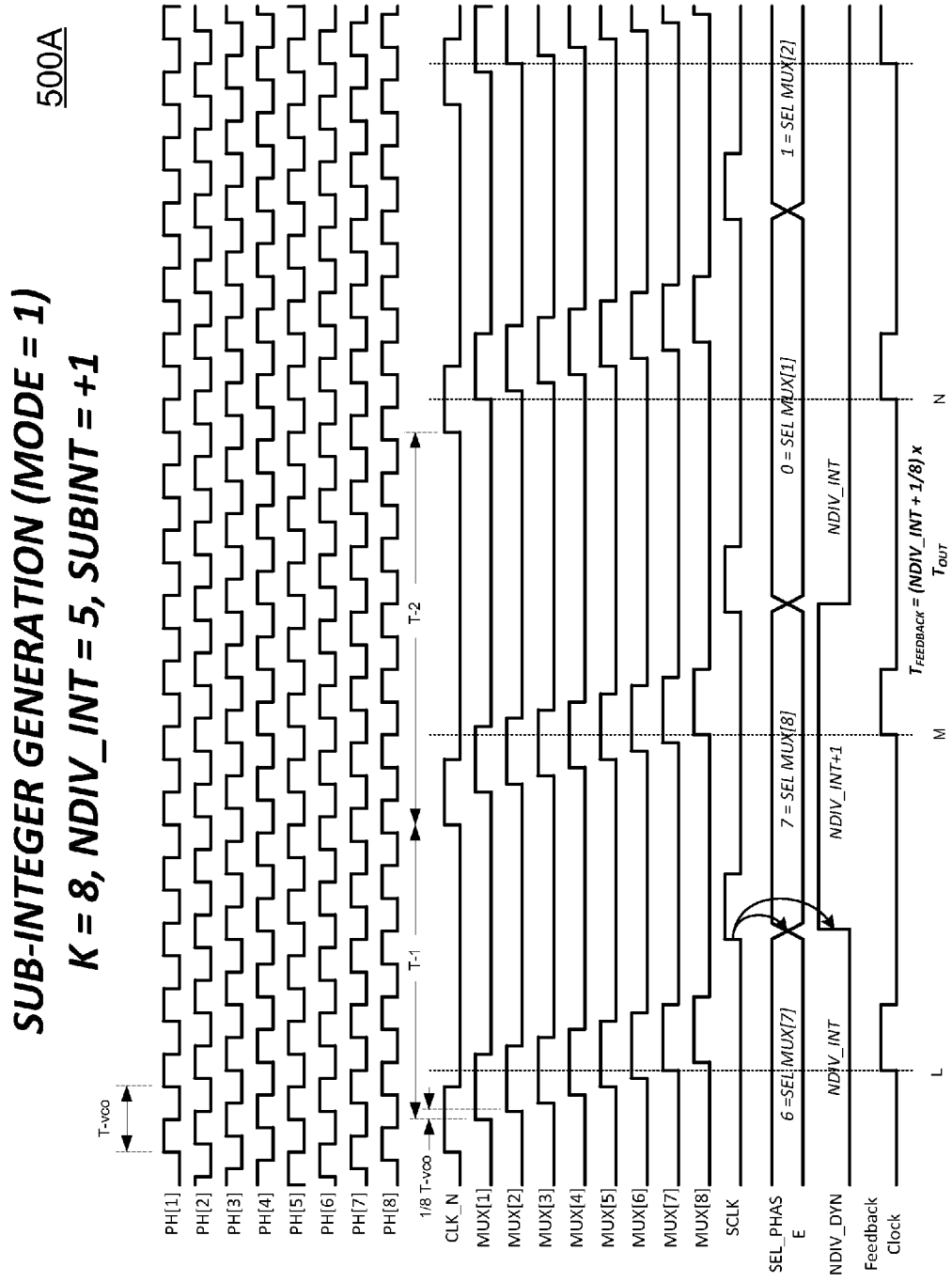

FIG. 5A depicts a signal diagram of a PLL configured for quantization-free sub-integer generation with a static control value of +1, in accordance with one embodiment of the present disclosure.

Figure 5B:
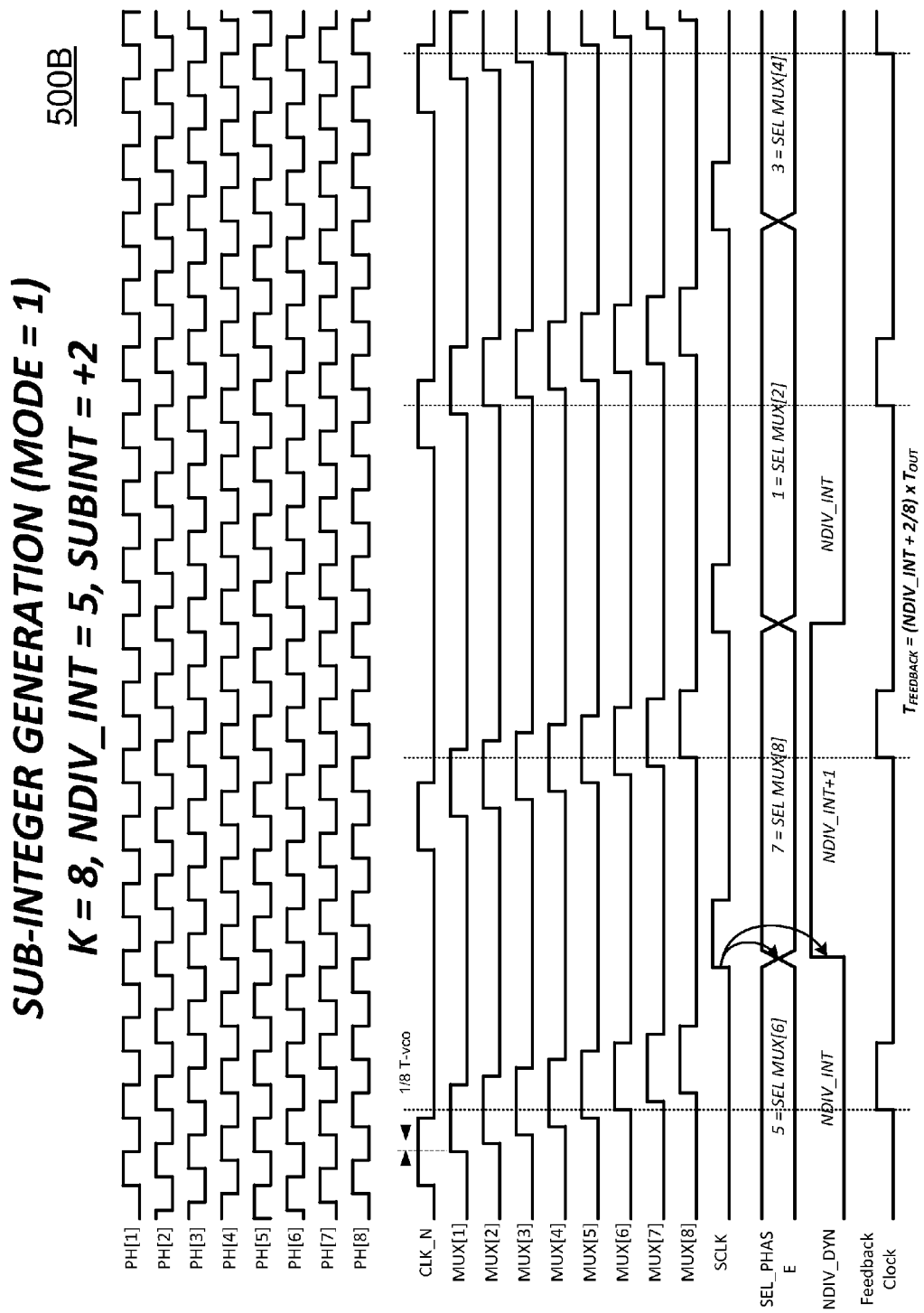

FIG. 5B depicts a signal diagram of a PLL configured for quantization-free sub-integer generation with a static control value of +2, in accordance with one embodiment of the present disclosure.

Figure 5C:
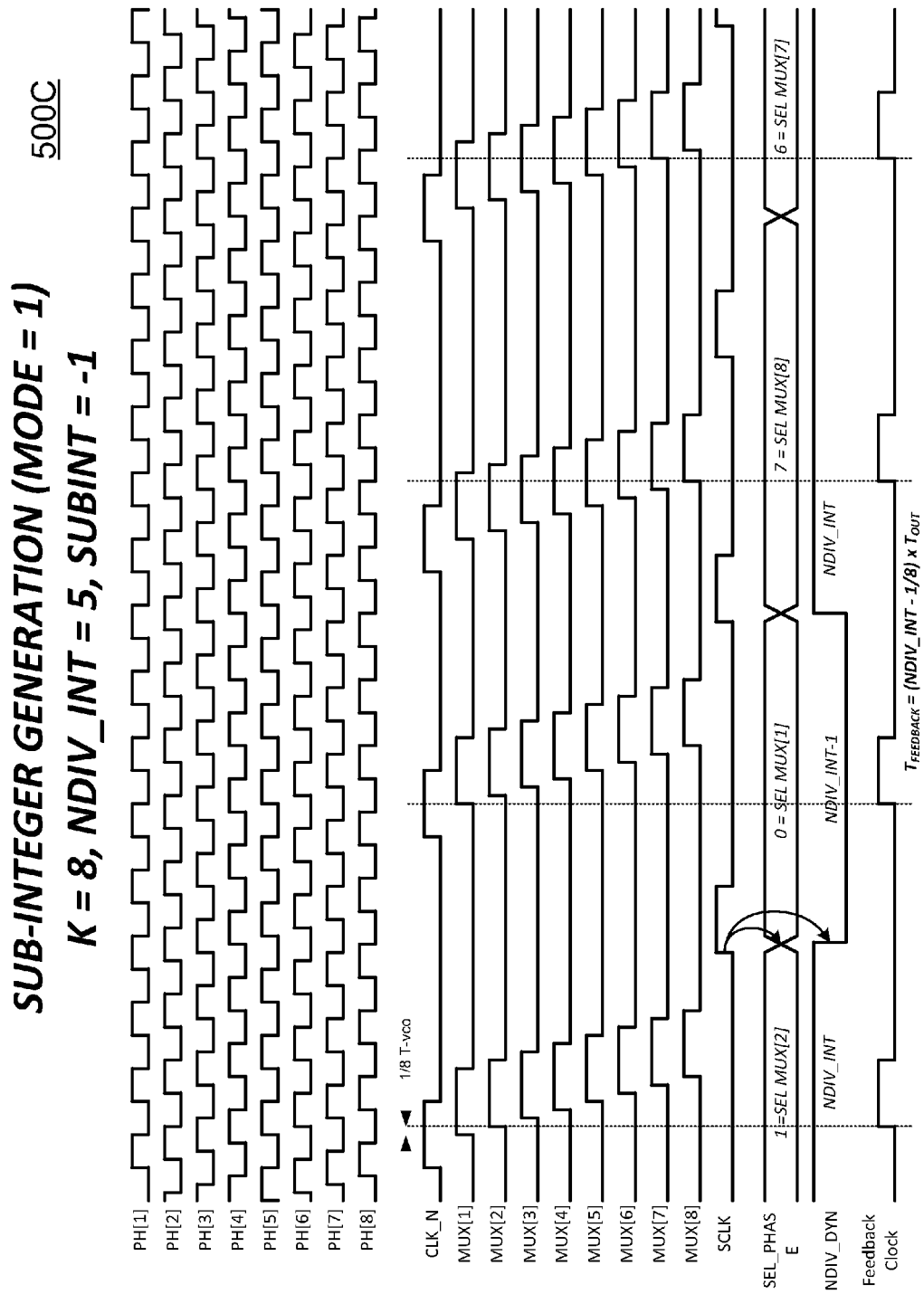

FIG. 5C depicts a signal diagram of a PLL configured for quantization-free sub-integer generation with a static control value of −1, in accordance with one embodiment of the present disclosure.

Figure 6:
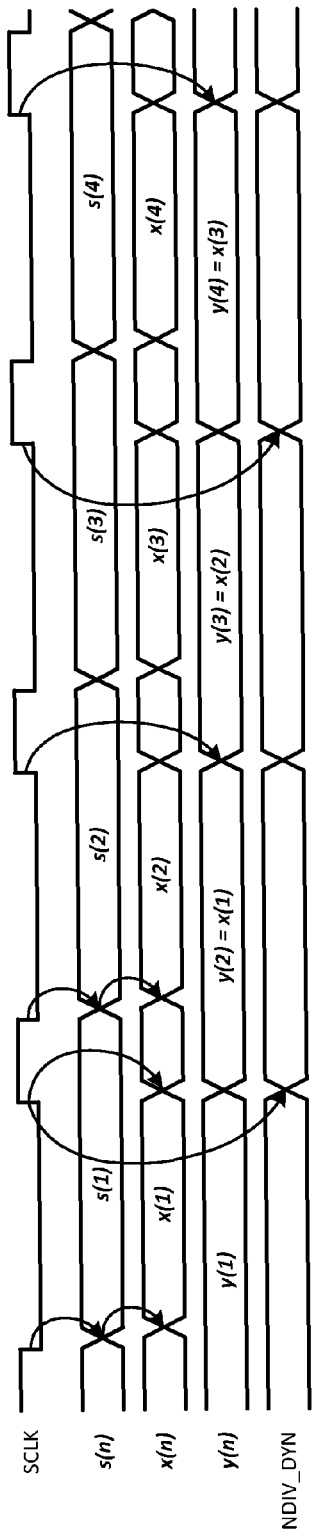

FIG. 6 depicts a signal diagram of a rotator timing diagram in a PLL configured either for quantization-free sub-integer generation or for phase-dithered fractional-N generation, in accordance with one embodiment of the present disclosure.

Figure 7:
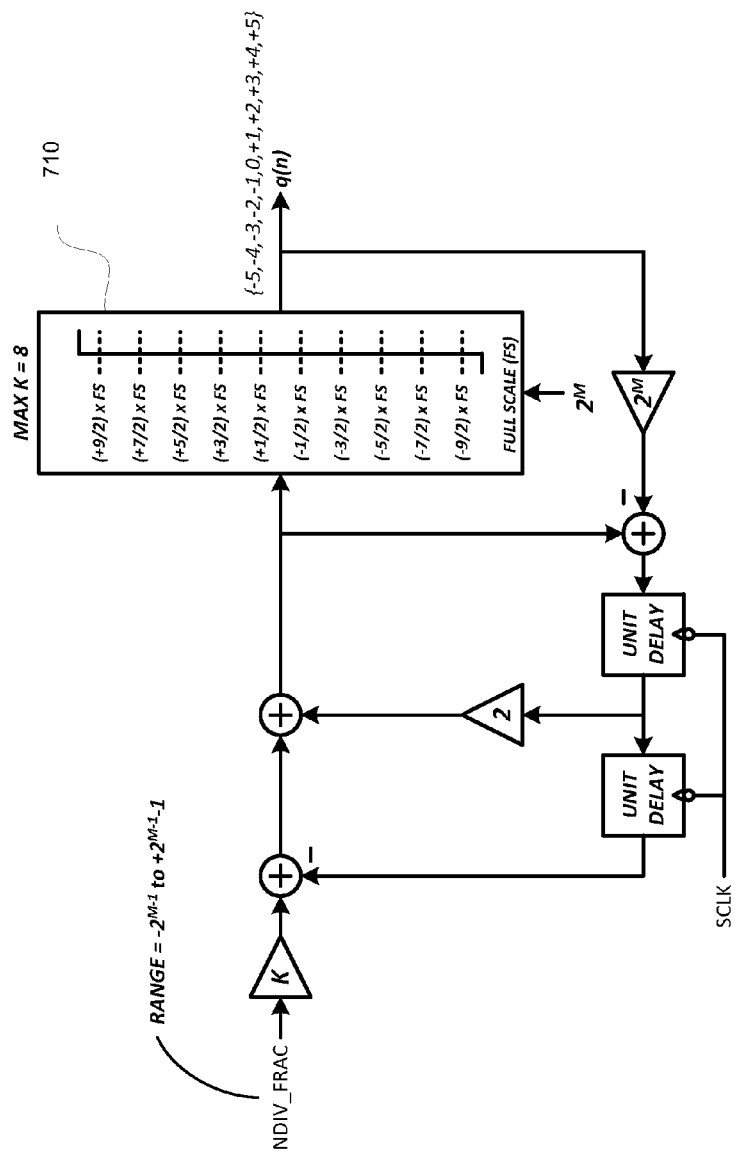

FIG. 7 depicts a DSM used in a PLL configured for phase-dithered fractional-N generation, in accordance with one embodiment of the present disclosure.

Figure 8:
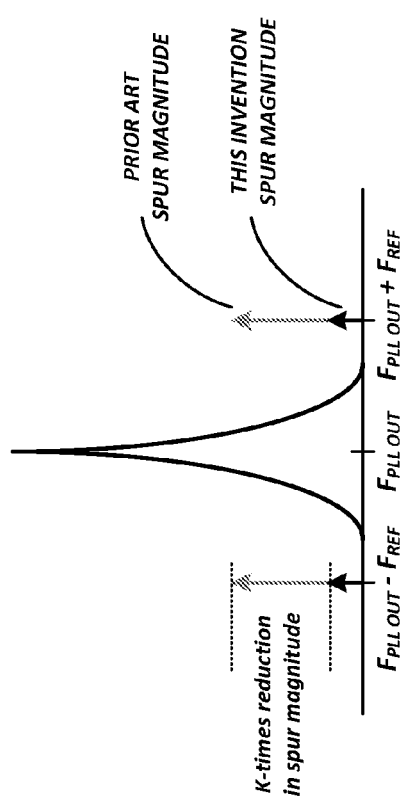

FIG. 8 is an illustration of the reduction in spurs for PLLs of embodiments of the present invention over PLLs in the prior art, in accordance with one embodiment of the present disclosure.

Figure 9:
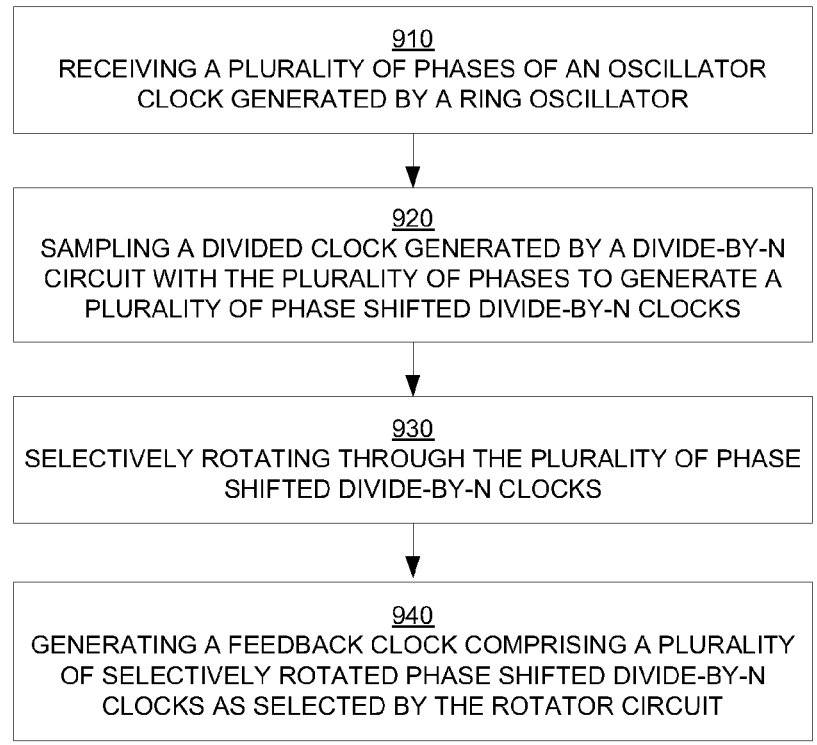

FIG. 9 is a flow diagram illustrating a method for fractional-N generation in a PLL configured for quantization-free sub-integer generation and/or phase-dithered fractional-N generation, in accordance with one embodiment of the present disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Figure 2:
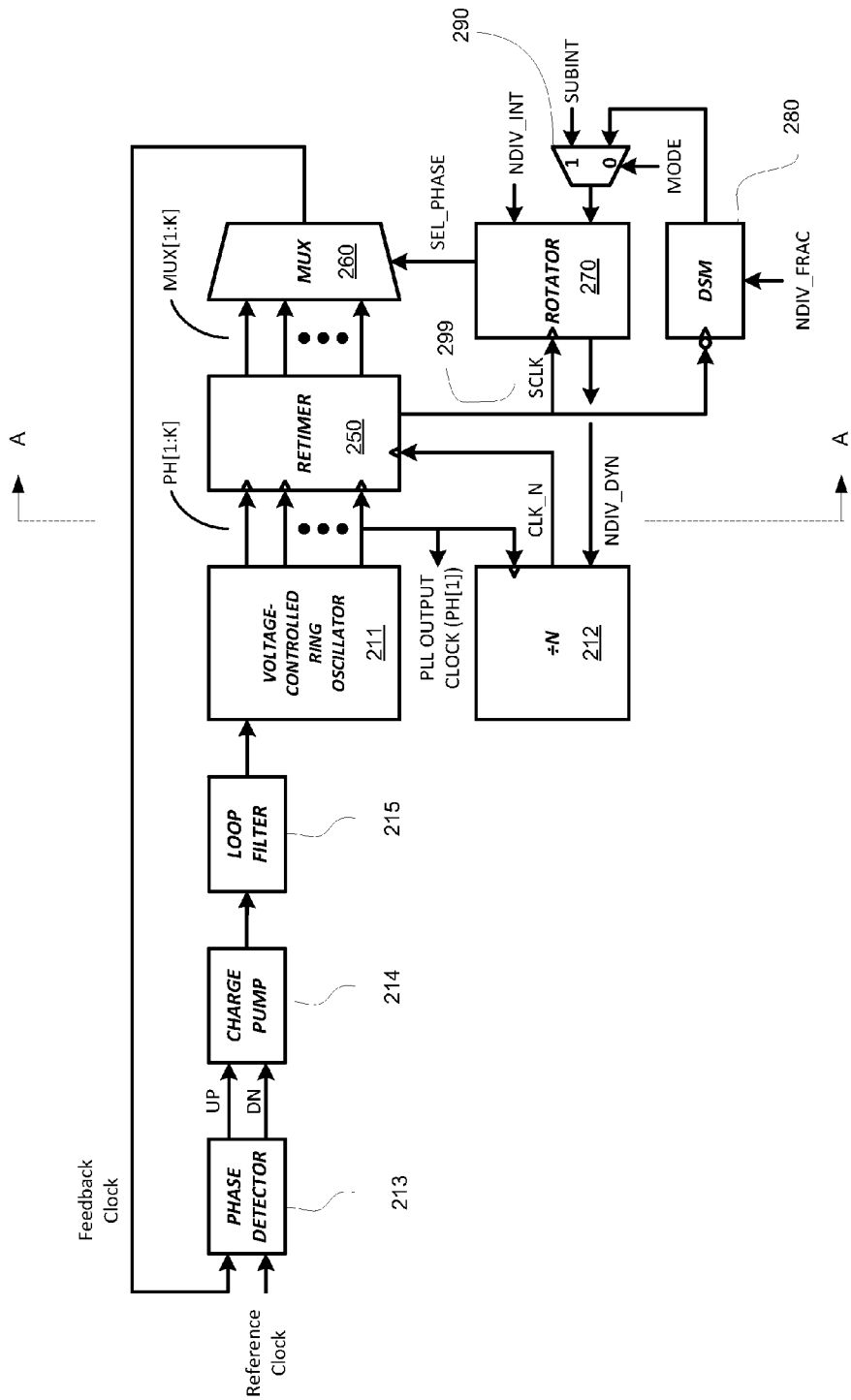
FIG. 2 depicts a block diagram of a charge-pump PLL configured for quantization-free sub-integer generation and phase-dithered fractional-N generation, in accordance with one embodiment of the present disclosure.

Embodiments of the present invention are implemented in hardware and/or software for purposes of performing frequency synthesis. In particular, FIG. 2 is a flowchart of examples of computer-implemented and/or hardware implemented methods for performing fractional-N generation in a PLL, according to embodiments of the present invention. Although specific steps are disclosed in the flowcharts, such steps are exemplary. That is, embodiments of the present invention are well-suited to performing various other steps or variations of the steps recited in the flowcharts.

Other embodiments described herein may be discussed in the general context of a hardware implementation performing fractional-N generation in a PLL. That is, various electronic components are configured to perform analog or logic operations consistent within a PLL, including quantization-free sub-integer generation and/or phase-dithered fractional-N generation.

Embodiments of the present invention are applied to a significantly broader class of PLLs that employ a simple divide-by-N counter in lieu of the multi-modulus divider described in PRIOR ART 100B. Additionally, other embodiments of the present invention resolve the problems and limitations of the PRIOR ART 100B by disclosing an alternative divided clock sampler (retimer) that does not exhibit potential problems with setup time violations of the prior-art. Additionally, embodiments of the present invention disclose a rotator unit implemented in lieu of the controller of PLL 100B that allows for rotated phase selection in both clock-wise and counter-clock-wise steppings, wherein the rotator unit allows for generation of both positive and negative fractional divide values. In embodiments of the present invention, the rotator machine contains a unique accumulator unit that allows for a plurality of VCO phases whose number is any positive even value greater than or equal to 4. Furthermore, in other embodiments of the present invention a unique state machine embedded in the rotator unit allows for seamless generation of fractional divide values from a simple divide-by-N counter without requirement of any range extension control, as in PLL 100B of the prior-art. Finally, embodiments of the present invention disclose a delta-sigma modulator implementation that defines a precise mathematical relationship between the number of available VCO phases and the required number of quantizer levels in the modulator.

FIG. 2 depicts a PLL 200, which is intended to represent both analog and digitally implemented PLLs. PLL 200 is configured for quantization-free sub-integer generation and phase-dithered fractional-N generation using analog or digital based components, such as phase detector 223, digital loop filter 225, digitally controlled ring oscillator 221, and divide-by-N unit 222. In general, the function of the PLL 200 is to compare the feedback clock to the incoming reference clock, and vary the phase and frequency of its output unit so that the reference and feedback clock signals are phase and frequency matched, in accordance with one embodiment of the present disclosure. The PLL 200 of FIG. 2 utilize elements similarly used in prior art implementations, to include one or more of the following elements, such as phase detector, charge pump, loop filter, and VCO.

Figure 1A:
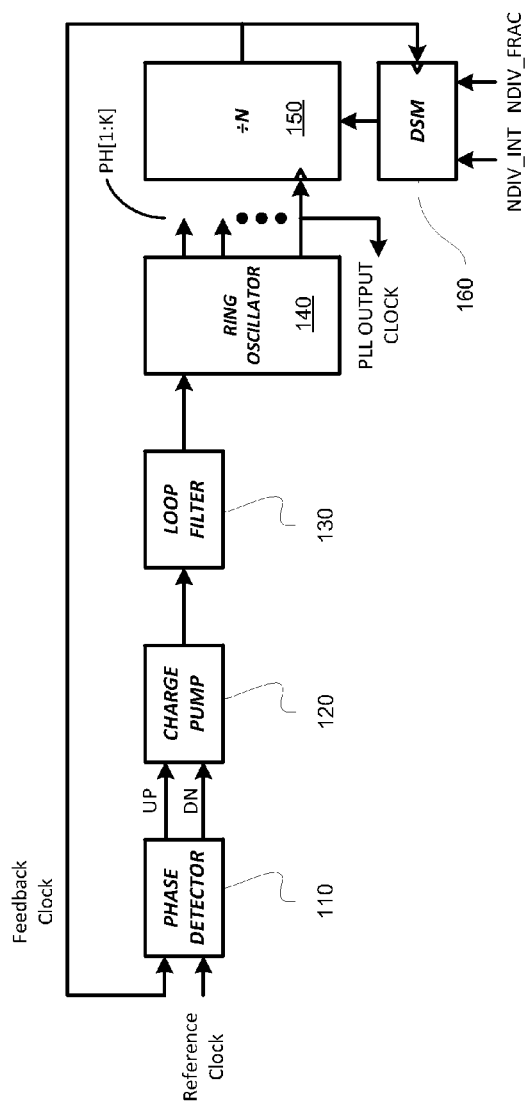
FIG. 1A is a block diagram of a traditional fractional-N charge-pump PLL.
Figure 1B:
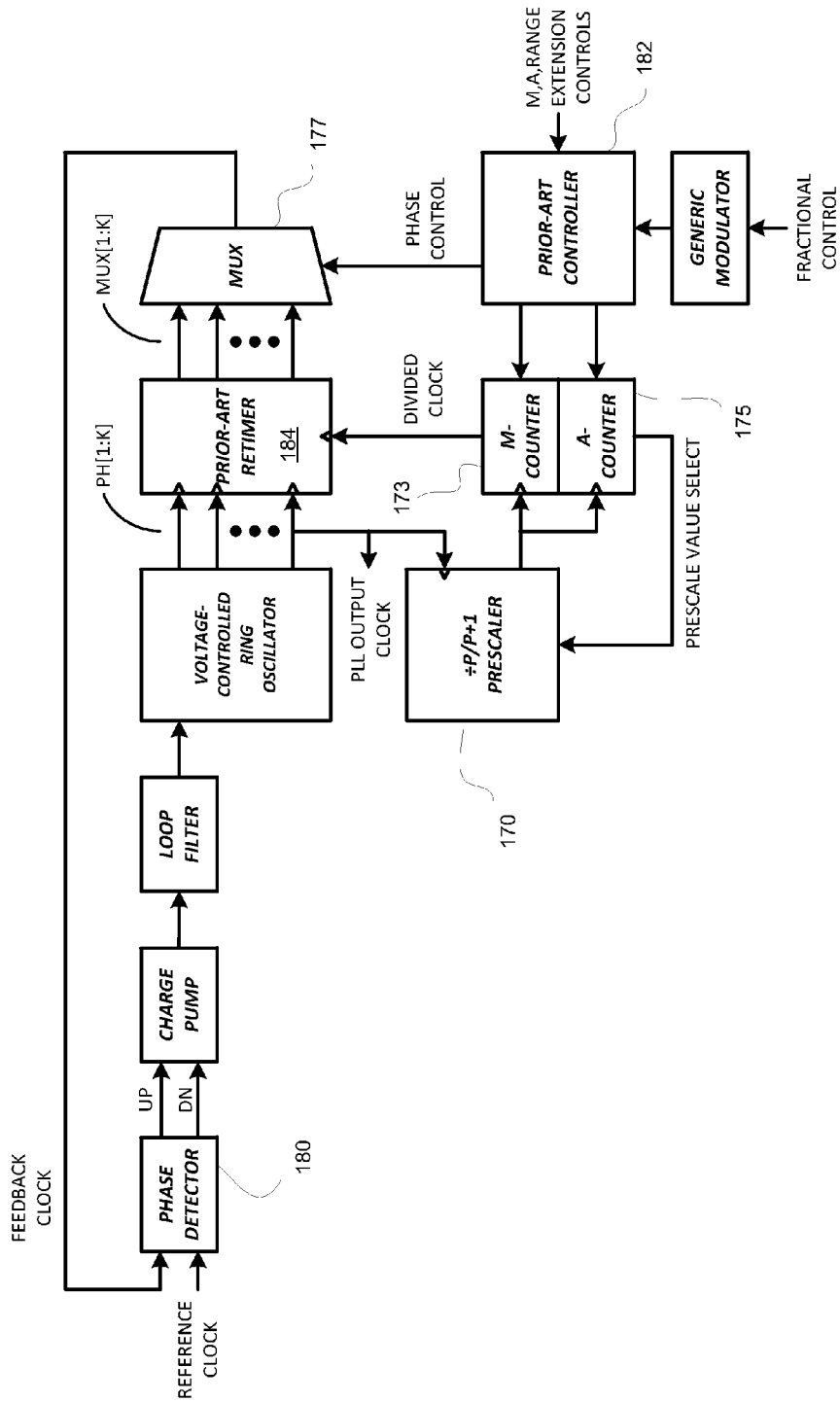
FIG. 1B is a block diagram of an alternative implementation that seeks to reduce spur energy over a traditional fractional-N charge-pump PLL, such as, that shown in PRIOR ART FIG. 1A.

In particular, FIG. 2 depicts a block diagram of a PLL 200A configured for quantization-free sub-integer generation and phase-dithered fractional-N generation, in accordance with one embodiment of the present disclosure. PLL 200A employs the phase detector 213, charge pump 214, loop filter 215, divide-by-N unit 212 and VCO 211 whose functions are described in the description of PRIOR ART FIG. 1.

The key difference between embodiments of the present invention and the prior-art is the method of fractional-N generation using the key features previously described, including a retimer unit 250, a clock selector circuit (e.g., multiplexor [MUX]) 260, a rotator 270, a DSM 280, and a mode selector 290. More particularly, instead of scrambling the divide-by-N value to produce a fractional bias in $N_{eff}$, embodiments of the present invention take advantage of the fundamental premise that small, fractional deviations from integer-N operation can be achieved by continuously adjusting the phase of the feedback clock. Frequency is defined as the rate of change of phase over time, and embodiments of the present invention employ each of K phases of the VCO clock to continually fine-adjust the phase of the feedback clock returning to the phase detector in lieu of forcing coarse phase changes by adjustment of the divide-by-N, as will be described more fully below in relation not FIGS. 3 and 4.

For implementation of quantization-free sub-integer and phase-dithered fractional-N operations, the retimer unit 250 is configured for sampling a divided clock with a plurality of phases of a VCO clock, the rotator 270 is configured for generating a control signal, SEL_PHASE, that rotates the selection of the plurality of phase-shifted divide-by-N clocks through clock selection unit 260. Additionally, in the phase-dithered fractional-N operation, the DSM 280 is configured for scrambling the digital input of the rotator 270 so that the rotation of control signal SEL_PHASE is scrambled to produce a time-average fractional rate of rotation of selection of the plurality of phase-shifted divide-by-N clocks through clock selection unit 260. DSM 280 is of first or higher order.

Sub-Integer Operation

In the sub-integer mode of operation, a method and system are disclosed for producing a sub-integer divide-by-N value that generates zero instantaneous phase error during PLL tracking, and hence zero fractional-N spur content in the spectrum of the VCO clock. The term "sub-integer" is used to refer to fractional values confined to $[-(K-1)/K, +(K-1)/K]$, where K is the number of phases of the VCO. K is defined as a positive and even integer, with minimum value of 4 and no defined maximum value.

Sub-integer fractional-N generation is quantization-free. In particular, the sub-integer fractional-N operation produces a sub-integer divide-by-N value that generates zero instantaneous phase error during PLL tracking, and hence zero fractional-N spur content in the spectrum of the VCO clock. The sub-integer fractional-N operation generates output frequencies that are fractional-N(e.g., N+fraction) multiples of the reference frequency, wherein the fraction is set in static intervals based on a number of phases generated on a ring oscillator, or VCO. Further, embodiments of the present invention are able to further reduce the power of quantization or phase noise over traditional fractional-N generation techniques by greatly reducing the dynamic changing of the divide value N, and by implementing fractional-N value generation by means of controlled selection of multiple phases of a PLL feedback divided clock. The term "sub-integer" is used to refer to fractional values confined to [−(K−1)/K, +(K−1)/K], where K is the number of phases of the VCO (e.g., 211 or 221). K is defined as a positive even integer, with minimum value of 4 and no defined maximum value.

For example, for quantization-free fractional-N generation, the selection of the time-shifted divided clocks is performed in a manner promoting a static frequency offset. In particular, the staggered phases of the divide-by-N clock are returned in feedback, one by one in a rotated manner every update cycle of the PLL. The selection of staggered phases is quantization-free because the change in phase is deterministic, unchanging, and static (e.g., MUX[1] to MUX[2] to MUX[3], etc.; or MUX[1] to MUX[3] to MUX[5], etc.). For instance, for positive offsets from N, the method includes selecting phases of divided clocks in increasing time fashion by rotating through the plurality of time shifted divided clocks by a specific time shift interval. Also, for negative offsets from N, the method includes selecting divided clocks in decreasing time shifting fashion by rotating through the plurality of time shifted divided clocks by a specific time interval.

Specifically, if the selection is stepped, positively or negatively, one adjacent phase at a time, the period of the feedback clock returning to the phase detector is expanded (or contracted) by (1/K) times the period of the VCO clock, yielding an effective divide value of N+(1/K) (or N−(1/K)). Also, integer multiples of this offset are created in one embodiment by skipping phases in the rotation sequence. In that manner, sub-integer offsets to the value of N can be created by skipping phases in the rotation sequence.

Returning back to FIG. 2, the first VCO clock phase, PH[1], is delivered to the divide-by-N counter input, which is programmed to divide by a positive integer value NDIV_DYN. NDIV_DYN can take the value of NDIV_INT+{−1, 0, +1}, and the value selected is described later. CLK_N is defined as the output of the divide-by-N unit 212, and is subsequently sampled by PH[1:8] inside the retimer unit 250 to produce a plurality of phase-shifted divide-by-N clocks, MUX[1:8]. The generation of MUX[1:8] remains the same for all values of SUBINT.

In the sub-integer mode of operation, variable MODE in the mode selector 290 is set to 1 and the value of variable SUBINT is passed to a rotator unit 270. The value of SUBINT is [−(K−1), +(K−1)] inclusive, which yields a one-to-one correspondence with sub-integer divide values of [−(K−1)/K, +(K−1)/K] inclusive. In one embodiment, K is a positive even integer with minimum value of 4 and no defined maximum. For purposes of illustration only in one example used throughout the application, K is defined as K=8.

In one embodiment, a PLL implementing sub-integer fractional-N generation includes a retimer unit 250, a rotator unit 270, and a clock section unit 260. The retimer unit is configured for sampling a divided clock generated by a divide-by-N unit (e.g., 212 or 222) with a plurality of phases of a VCO clock generated by a ring oscillator (e.g., 222 or 221) to generate a plurality of phase shifted divide-by-N clocks (e.g., PH[1:K] used to generate MUX[1:K]). The rotator unit 270 is configured for generating a control signal, SEL_PHASE, that rotates the selection of the plurality of phase-shifted divide-by-N clocks through clock selection unit 260 based on a constant phase shift interval. Further, the rate of change of phase of the feedback clock is constant to realize zero instantaneous phase error during PLL tracking, and hence zero fractional-N spur content.

More particularly, the defined phase shift interval is defined by a SUBINT value, which can be positive or negative as previously described. A positive value defines a positive rotation through the plurality of phase shifted divide-by-N clocks, wherein as a negative value defines a negative rotation through the plurality of phase shifted divide-by-N clocks.

As illustrated in PLL 200 of FIG. 2, for sub-integer fractional-N operation, a first VCO clock phase (e.g., PH[1]) is delivered to the divide-by-N unit (e.g., 212 or 222). The divide-by-N unit is programmed to divide by a positive integer value NDIV_DYN, wherein NDIV_DYN can take the value of NDIV_INT+{−1, 0, +1}, as will be more fully described below.

CLK_N is generated as the output of the divide-by-N unit (e.g., 212 or 222), with period NDIV_DYN times the period of clock PH[1]. Additionally, the duty cycle of CLK_N is such that the clock exhibits logical high value for the duration of one period of PH[1], and logical low value for the duration of (NDIV_DYN−1) times the period of PH[1]. CLK_N is subsequently sampled by PH[1:8] inside a retimer unit 250 to produce a plurality of phase-shifted divide-by-N clocks, MUX[1:8]. The generation of MUX[1:8] remains the same for all values of SUBINT. Generation of MUX[1:8] is performed by the retimer unit 250.

Also shown in FIG. 2, taking the example where K=8, each of MUX[1:8] has a phase spacing of $T_{VCO}/8$, and is connected to a 8:1 selection MUX that will return 1 of the 8 possible divided clocks to the phase detector. A system update clock, "SCLK" 299 which is phase-offset from CLK_N and MUX[1:8], is used to update the selection of MUX[1:8] through the 8:1 MUX.

Figure 3A:
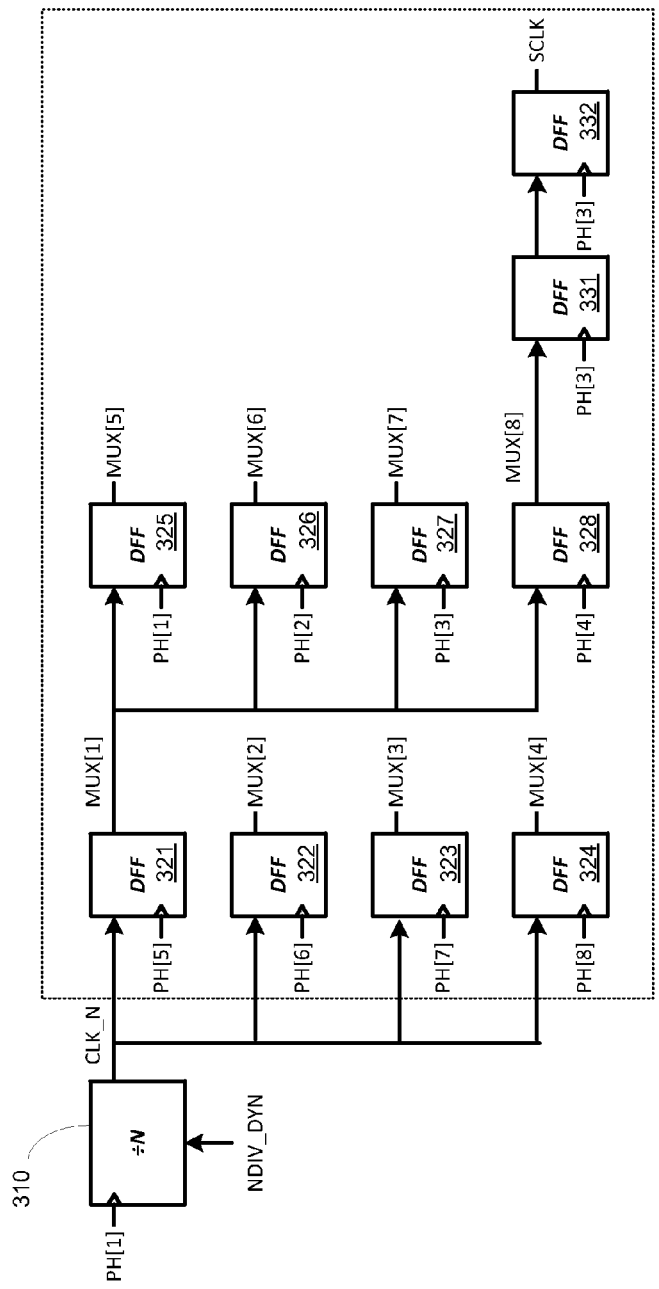
FIG. 3A depicts a block diagram of a retimer unit configured for generating a plurality of time-shifted divide-by-N clocks when K=8, in accordance with one embodiment of the present disclosure.

FIG. 3A depicts a block diagram of a retimer unit 300A configured for generating a plurality of phase shifted divide-by-N clocks, MUX[1 . . . 8], in accordance with one embodiment of the present disclosure. As shown, a divide-by-N circuit 310 receives a first phase, referred to as PH[1], of a VCO clock. In one embodiment, the ring oscillator 130 is configured to create any number of phases, "K", greater than or equal to three (3). Since the ring oscillator has no beginning, one of the phases is arbitrarily designated as PH[1] with PH[2:K] being successive, contiguous phases of the clock.

Figure 3B:
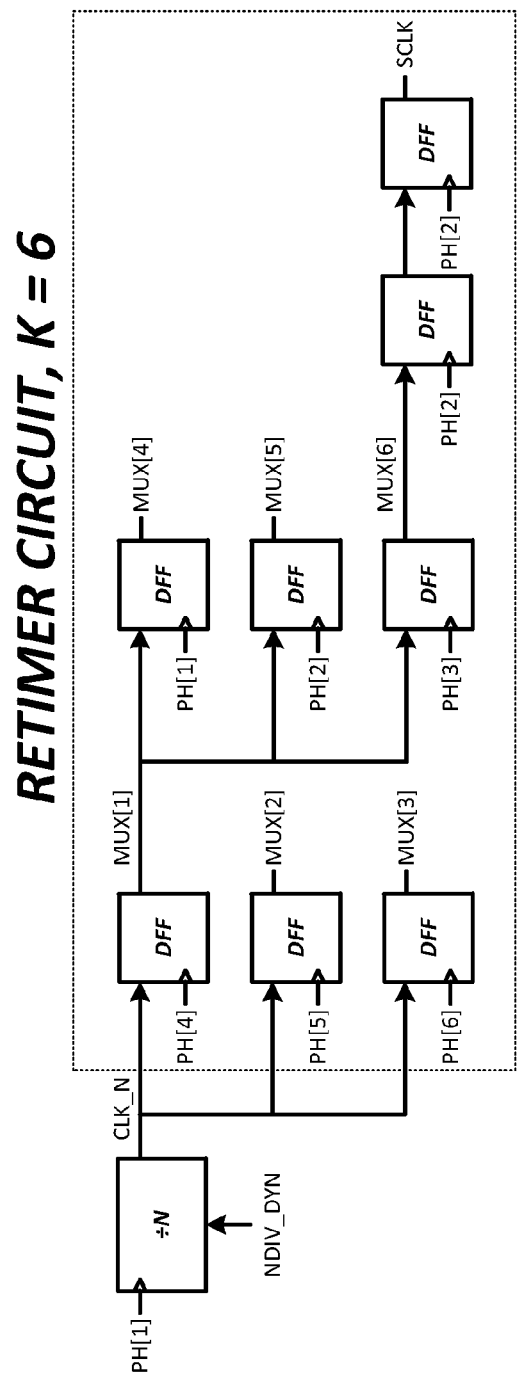
FIG. 3B depicts a block diagram of a retimer unit configured for generating a plurality of time-shifted divide-by-N clocks when K=6, in accordance with one embodiment of the present disclosure.

The divide-by-N circuit 310 divides PH[1] by NDIV_DYN to generate a divided clock, referred to as CLK_N in FIGS. 3A and 3B, wherein generation of NDIV_DYN is described below in reference to FIG. 4. Retimer unit 300A is configured to resample CLK_N or a derivative of CLK_N with each of the phases of the VCO clock. The retimer unit 300A comprises a plurality of flip-flops (e.g., D-type flip-flops) for performing the sampling, in one embodiment. For instance, CLK_N is sampled with PH[5] in D-type flip flop 321 to generate MUX[1]; CLK_N is sampled with PH[6] in D-type flip flop 322 to generate MUX[2]; CLK_N is sampled with PH[7] in D-type flip flop 323 to generate MUX[3]; CLK_N is sampled with PH[8] in D-type flip flop 324 to generate MUX[4]. Also, a derivative of CLK_N, which is MUX[1], is sampled with PH[1] in D-type flip flop 325 to generate MUX[5]; MUX[1] is sampled with PH[2] in D-type flip flop 326 to generate MUX[6]; and MUX[1] is sampled with PH[3] in D-type flip flop 327 to generate MUX[7]. As such, CLK_N and the derivative of CLK_N are chosen because they are guaranteed to be at logical high value when sampling is performed.

Figure 3C:
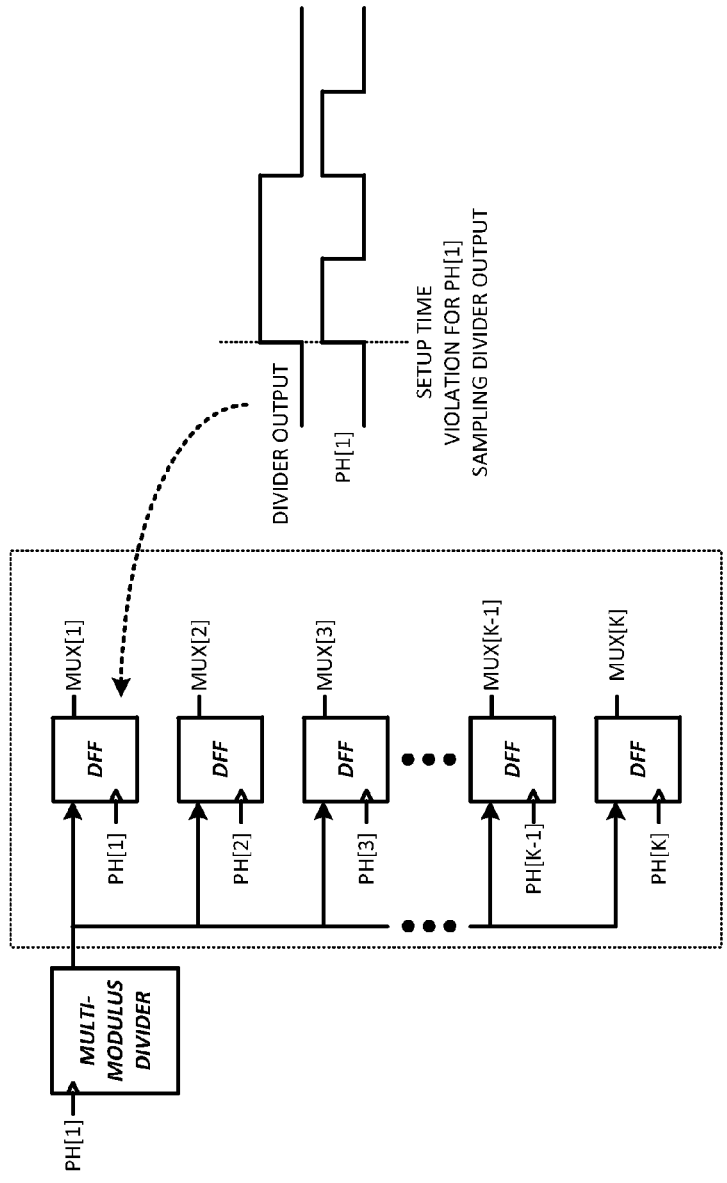

While the functional goal of the retimer unit 300A of embodiments of the present invention is the same as that of the prior-art, the prior-art implementation, as shown in FIG. 3C demonstrates a problematic setup violation when sampling the multi-modulus divider output with the same VCO clock phase that is used to generate the divided clock (PH[1]). That is, there is inadequate hold time. To circumvent this problem, for K=8 shown in FIG. 3A, the retimer unit 300A samples the divide-by-N output (CLK_N) with the rising edge of PH[5], which sits close to the center of the logical high pulse of CLK_N. PH[6:8] are used to sample the same pulse with adequate hold time, and the aggregate result is the generation of the first 4 phases of the plurality of divided clock phases, MUX[1:4]. In general, for any positive, even value of K greater than or equal to 4, the phase [(K/2)+1] is the first phase used to sample CLK_N, in one embodiment (e.g., for K=8, PH[5] or phase 5 is the first phase). Continuing to sample CLK_N with PH[1] would cause a hold-time violation, so MUX[1] is sampled by the rising edges of PH[1:4] to produce the remaining MUX[5:8]. A similar retimer scheme has been illustrated for the case of K=6, shown in FIG. 3B.

FIGS. 5A-C are signal diagrams of sub-integer fractional-N generation, where K=8 and NDIV_INT=5. In particular, FIG. 5A depicts a signal diagram 500A generated by a PLL that is configured for quantization-free sub-integer generation with a sub-integer value of +1, in accordance with one embodiment of the present disclosure. FIG. 5B depicts a signal diagram 500B of a PLL that is configured for quantization-free sub-integer generation with a sub-integer value of +2, in accordance with one embodiment of the present disclosure. Also, FIG. 5C depicts a signal diagram 500C of a PLL configured for quantization-free sub-integer generation with a sub-integer value of −1, in accordance with one embodiment of the present disclosure.

Also shown in FIGS. 5A-C is the plurality of phase shifted VCO clocks (e.g., PH[1:K]). CLK_N is derived from PH[1], as an example, and as such the rising edge of CLK_N is synchronous with the rising edge of PH[1].

As illustrated in each of the signal diagrams 500A-C, each of MUX[1:8] has a phase spacing of $T_{VCO}/8$, and is connected to a 8:1 selection MUX that will return 1 of the 8 possible divided clocks to the phase detector of a corresponding PLL.

A system update clock, "SCLK" which is phase-offset from CLK_N and MUX[1:8], is used to update the selection of MUX[1:8] through the 8:1 MUX 260. In one embodiment shown in FIG. 3, MUX[8] is sampled with PH[3] twice in D-type flip flops 331 and 332 to generate SCLK. By sampling the signal twice with PH[3], the logical high pulse of SCLK does not overlap with the logical high pulses of any of the phase shifted divide-by-N clock signals MUX[1:8]. Additionally, this requirement of non-overlap places a restriction on the minimum value of NDIV_INT. For instance, in FIG. 5A, the minimum value of NDIV_INT is 5.

Referring now to FIG. 5A, for the case of SUBINT=+1, NDIV_DYN is initially defined as NDIV_DYN=NDIV_INT. Then, MUX[1] is selected at cycle 1 of SCLK, followed by selection of MUX[2] at cycle 2 of SCLK, and so on until MUX[8] is selected at cycle 8 of SCLK. This updated selection of clock phases constitutes a constant rate of change of the feedback clock phase of $T_{VCO}/8$ per update time.

If MUX[1] is selected at cycle 9 of SCLK, NDIV_DYN must assume the value of NDIV_INT+1, otherwise the rate of change of phase will drop back to 0. Thus, it is clear that when the selection of MUX[1:8] "rolls over" in a given cycle of SCLK, NDIV_DYN must assume NDIV_INT+1 for that cycle, and subsequently return to NDIV_INT the following cycle.

For the case of SUBINT=+1 as shown in FIG. 5A, it is clear that the feedback clock exhibits a period of (NDIV_INT+⅛)× $T_{VCO}$ because the phase of the feedback clock is continuously and constantly rotated by ⅛×$T_{VCO}$ each update cycle of SCLK. Thus, $N_{eff}$=NDIV_INT+⅛.

If, instead, SUBINT assumes the value −1, as illustrated in FIG. 5C, the direction of rotation of MUX[1:8] selection is reversed. NDIV_DYN assumes the value of NDIV_INT initially, and starting from MUX[8] in cycle 1 of SCLK, the selection progresses in reverse order until MUX[1] is selected in cycle 8 of SCLK. In cycle 9 of SCLK, the selection of MUX[1] "rolls under" to MUX[8], and NDIV_DYN must assume the value of NDIV_INT−1 to maintain the constant rate of change of phase, only in the reverse direction compared to the case of SUBINT=+1 (see diagram).

In order to physically realize this scheme of rotated selection of MUX[1:8], a rotator unit 270 is required. More particularly, FIG. 4 depicts a block diagram of a rotator unit 270 (e.g., circuit) configured for selecting a proper output for the MUX selection unit providing a feedback clock signal, in accordance with one embodiment of the present disclosure.

In one embodiment, the rotator unit 270 comprises a "modulo-K" accumulator 410 that will count in direction and magnitude specified by the value of SUBINT. The accumulator 410 comprises an adder 411 and a suffix function mod (u,K) 412. The modulo function is required to ensure that, when counting between [0, K−1] inclusive, the accumulator rolls over from K−1 to 0 (upward count) and rolls under from 0 to K−1 (downward count) especially in the cases where K is not a natural power of 2. The one hot decoder 413 produces K individual control lines used for selecting one of the plurality of phase shifted divide-by-N clock signals MUX[1:8].

In the sub-integer fractional-N operation, the mode selector 290 is set to 1, and s(n) is equal to SUB_INT. If SUBINT is positive, the accumulator 410 will count up, and roll over in value if the next count value is greater than K−1. On the other hand, if SUBINT is negative, the accumulator 410 will count down, and roll under in value if the next count value is less than 0. As shown, the count value, y(n), is decoded from binary to one-hot, so that the selection code is compatible with the 8:1 MUX.

If K happens to be a natural power of 2, the modulo-K function becomes unnecessary because the binary accumulator naturally rolls over/under at the boundary of 0 and K−1. For the case of K=8, the accumulator will naturally over/underflow at the boundary of 0 and 7. However, if K is not a power of 2, an explicit modulo-K function must be embedded in the accumulator so that the loop rolls over/under for counting ranges that are not a natural power of 2. For the case of K=6, the accumulator must be forced to over/underflow at the boundary of 0 and 5, which will not happen in a binary accumulator unless the modulo-K function is made explicit.

More particularly, the sequence of rotator values y(n), for K=8, is as follows:

SUBINT=+1: y(n)=0, 1, 2, 3, 4, 5, 6, 7, 0, 1, 2, 3, . . .
SUBINT=+2: y(n)=0, 2, 4, 6, 0, 2, 4, 6, 0, 2, 4, . . .
SUBINT=+3: y(n)=0, 3, 6, 1, 4, 7, 2, 5, 0, 3, 6, . . .
SUBINT=−1: y(n)=0, 7, 6, 5, 4, 3, 2, 1, 0, 7, 6, 5, . . .
SUBINT=−2: y(n)=0, 6, 4, 2, 0, 2, 4, 6, 0, 2, 4, 6, . . .
SUBINT=−3: y(n)=0, 5, 2, 7, 4, 1, 6, 3, 0, 5, 2, 7, . . .

As illustrated in FIG. 4, for a given cycle of SCLK that produces y(n) at the accumulator output, the following cycle of SCLK will yield y(n+1)=x(n)+y(n). That is, the current cycle "x" value becomes the following cycle "y" value. Given this information, an upcoming cycle roll-over or roll-under can be anticipated and logic is provided to update NDIV_DYN. The logic is implemented by comparison units x(n)<y (n) and s(n)<0. In particular, the rotator unit 270 comprises an overflow unit and/or logic configured for adjusting the integer value of NDIV_DYN by one for one update cycle of the feedback clock under roll-over and roll-under conditions.

In particular, during roll-over or roll-under conditions, the integer-N divide value is adjusted when the first phase in the rotation sequence, in the positive or negative rotation direction, replaces the last phase, such as when stepping one adjacent phase at a time. That is, for one update cycle, the integer divider is incremented or decremented by one after each reference cycle has completed. This occurs when reaching the last phase in the rotation and returning to the beginning phase of the rotation. In another embodiment, this is also performed when skipping phases in a positive or negative direction. For instance, the integer value is increased by positive one at a roll-over in a positive rotation of the plurality of phase shifted divide-by-N clocks. Also, the integer value is decreased by one at a roll-under in a negative rotation of the plurality of phase shifted divide-by-N clocks. Thereafter, the value of the integer divider is returned in the next update cycle.

As an example, as shown in FIG. 4, when x(n)<y(n) this constitutes a roll-over condition. That is, as the accumulator counts up, the roll-over condition occurs when x(n)<y(n). Further, when x(n)<y(n) is a true condition, this gives a value of 1 in logic block 421. The roll-over condition occurs for the case when s(n) is greater than 0 (the rotator moving in a clock-wise direction), which is a false condition in logic block 422, giving a value of 0 being input into the accumulator 430. As such, the value of 1 from the accumulator/adder 430 is added to NDIV_INT under the roll-over condition, so that NDIV_DYN is a retimed version of NDIV_INT+1.

FIG. 5A shows a roll-over condition between the second and third cycles. That is, as the accumulator counts down, when x(n)>y(n), this constitutes a roll-under condition. This is for the case when s(n) is less than 0 (the rotator moving in a counter clock-wise direction). In this case, the value of logic block s(n)<0 is true, giving a value of 1. When x(n)<y(n), logic block 421 is 1, and the accumulator 430 generates a value of 0, the accumulator has not rolled-over. However, when x(n)>y(n), this constitutes a roll-under condition, and logic block 421 is 0. As such, the accumulator has a value of −1, which means that NDIV_DYN is a retimed version of NDIV_INT−1.

As shown in FIG. 5A, in the first cycle, MUX[7] is selected; and in the second cycle, MUX[8] is selected. In the third cycle, a roll-over condition back to MUX[1] occurs. In this case, under the roll-over condition when transitioning between MUX[8] to MUX[1], the constant rate of phase rotation (e.g., ⅛ Tyco) is maintained. If NDIV_DYN were not updated upon this roll-over, the phase of the feedback clock would fallback a full value of $T_{VCO}$, causing $N_{eff}$ to revert from NDIV_INT+(⅛) back to NDIV_INT during the roll-over cycle. This is shown in FIG. 5A, wherein by adjusting NDIV_DYN for one cycle, the period T−1 between the rising edges of CLK_N between MUX[7] and MUX[8] is less than the period T−2 between the rising edges of MUX[8] and MUX[1] by one $T_{VCO}$. As a result, the sub-integer period defined in $T_{feedback}$ is preserved. This is shown where the distance between dotted lines L, M, and N is constant.

Moreover, as illustrated in FIGS. 5A-C, the value of SUBINT dictates the number of contiguous elements of MUX[1:8] to skip over in the rotated selection. If SUBINT=+2, then the resulting rate of change of phase of the feedback clock is +2×$T_{VCO}$/8. It follows that $N_{eff}$=NDIV_INT+SUBINT/8, where SUBINT can assume the values [−7, +7] inclusive. Because the rate of change of phase of the feedback clock, dictated by the value of SUBINT, always remains constant, the feedback clock never experiences instantaneous changes in phase, such that $T_{feedback}$ remains constant. Consequently, no phase error/spur power is generated when the invention is set in sub-integer mode (MODE=1).

Phase-Dithered High Resolution Fractional-N Operation

In another mode of operation, a method and system for producing a fully fractional divide-by-N value that generates a spur K-times lower in absolute magnitude than the spur generated in prior art implementations is disclosed. Specially, in the phase-dithered fractional-N mode of operation, embodiments of the present invention provide for a fully fractional divide-by-N value, with higher resolution than its sub-integer counterpart, by dithering in time the rotated selection of multiple divide-by-N clock phases already described in embodiments of the present invention. Specifically, rotation through the sequence of phases always exists, both in sub-integer resolution and the high resolution fractional-N operations. However, in sub-integer resolution, the rate of rotation (e.g., 1/k or 2/k or 3/k, etc.) is static. On the other hand, in high resolution fractional implementation, the rate of rotation (e.g., between 1/k and 2/k) is dithered. While the phase-dithered fractional-N generation of the present embodiments is not quantization-free, it generates a spur that is K-times lower in absolute magnitude than the spur generated by the first prior-art implementation. This is shown in FIG. 8, which illustrates the reduction in spurs for PLLs of embodiments of the present invention over PLLs in the prior art, in accordance with one embodiment of the present disclosure.

In particular, the fractional component of the effective divide-by-N value is defined by an M-bit digital word, NDIV_FRAC, that can take any integer in the range [−$2^{M-1}$, +$2^{M-1}$−1] inclusive. $N_{eff}$ is defined as follows in Equation 1:

$$N_{eff} = NDIV\_INT + \frac{NDIV\_FRAC}{2^M} \qquad (1)$$

In equation 1, NDIV_INT is an unsigned digital word representing the integer portion of $N_{eff}$, while NDIV_FRAC is a signed 2's complement M-bit word that represents the fractional portion of $N_{eff}$, with NDIV_FRAC having selectable values [−$2^{M-1}$, $2^{M-1}$−1] inclusive.

In the phase-dithered fractional-N mode of operation, variable MODE in the mode selector 290 is set to 0. The PLL includes a retimer unit 250, a rotator unit 270, a DSM 280, and a clock selection circuit 260 (e.g., MUX). In contrast to mode 1, a mode 0 operation allows the DSM 280 to directly control the input of the rotator 270, with the control being a dithered sequence of signed integer numbers.

In the case of phase-dithered fractional-N generation, the selection of the phased shifted divide-by-N clocks is performed in a manner promoting a finer resolution of frequency offset generation. That is, the rate in which the rotation through the phases is dithered over time, and not held static when compared to the sub-integer mode of operation.

Also, the implementation of the rotated selection of MUX [1:8] remains the same for MODE=0 (phase-dithered fractional-N generation). In particular, the retimer unit 250 employs PH[1:8] to retime CLK_N into MUX[1:8], such that the retimer unit 250 is configured for sampling a divided clock generated by a divide-by-N unit with a plurality of phases of the VCO clock that is generated by a ring oscillator. The retimer unit 250 generates a plurality of phase shifted divide-by-N clocks by sampling a divided clock generated by a divide-by-N unit with a plurality of phases off the VCO clock.

In addition, as previously described the rotator unit 270 is used to cycle the selection of MUX[1:8] back to the phase detector (et, 213 or 223) while producing NDIV_DYN. That is, the rotator unit 270 is configured for selective rotation through the plurality of phase-shifted divide-by-N clocks MUX [1:8] based on a dynamically adjusted rate of phase rotation.

Further, a DSM 280 is configured for scrambling the phase rotation through the plurality of phase-shifted divide-by-N clocks MUX[1:8] to induce the dynamically adjusted rate of phase rotation. Also, a clock selection unit 260 is configured for generating a feedback clock comprising a plurality of selectively rotated phase shifted divide-by-N clocks MUX[1:8] as selected by the rotator unit 270.

In one embodiment, DSM 280 is configured to scramble the rate of rotation when selecting the plurality of phase shifted divided clocks. That is, the rate of rotation is controlled by the DSM 280. The DSM 280 has a specific number of quantizer levels based on the number of phases (K) of the VCO clock, or more specifically that has a fixed mathematical relationship with the number of phases of the VCO clock. In one embodiment, for any value of K, the number of quantizer levels is K+3.

As such, DSM 280 dithers the rate of rotation of the selection of the plurality of phase shifted divide-by-N clocks, such that finer resolution in frequency offset generation is realized. In one embodiment, DSM 280 dithering allows fractional-N values found within the following range, as defined in Equation 2 below.

$$[NDIV\_INT-\tfrac{1}{2}, NDIV\_INT+\tfrac{1}{2}-LSB], LSB=2^{-M} \qquad (2)$$

In particular, instead of driving the rotator unit 270 with a static SUBINT value, a DSM 280, that is coupled to the rotator unit 270 and updated on the falling edge of SCLK, is configured for generating a dynamically changing sequence, q(n), that scrambles the accumulated value of the rotator, as is shown in FIG. 4. FIG. 6 depicts a signal diagram of a rotator timing diagram 600 in a PLL configured either for quantization-free sub-integer generation or for phase-dithered fractional-N generation, in accordance with one embodiment of the present disclosure.

For example, if q(n) alternates between +1 and +2 for every cycle of SCLK, the phase update of the feedback clock would alternate between $+1 \times T_{VCO}/8$ and $+2 \times T_{VCO}/8$. The result would be a dynamically-adjusted rate of phase rotation, but the time-average rate of phase rotation would be $+1.5 \times T_{VCO}$. As a result, by dynamically scrambling the rate of phase rotation, instantaneous phase error is introduced every cycle of the feedback clock. The implementation of the PLL 100A exhibits instantaneous phase error of magnitude $T_{VCO}$ every cycle of the PLL reference clock. However, embodiments of the present invention reduce the instantaneous phase error magnitude from a prior-art value of $T_{VCO}$ to $T_{VCO}/8$, or in general, $T_{VCO}/K$. For example, DSM 280 creates a special sequence that scrambles the control between +1 and +2 so that the filtered errors are minimized. In one embodiment, DSM 280 does not perform simple weighted scrambling, which would be a sub-optimal solution.

In one embodiment, the DSM 280 of embodiments of the present invention scrambles the value of q(n) such that phase error power is weighted away from low frequencies to high frequencies. This allows for a reduction of overall spur power. Moreover, distinct from historical implementations of PLLs, the magnitude of phase error is reduced irrespective of how the DSM 280 shapes the spectral distribution of power.

In one embodiment, the range of the fractional component of Neff is $([-2^{M-1}, 2^{M-1}-1])/2^M$, which can be mathematically re-arranged as $-\tfrac{1}{2}$ to $+\tfrac{1}{2}-LSB$, where $LSB=\tfrac{1}{2}^M$. For any integer component NDIV_INT, a fractional value one LSB larger than $(+\tfrac{1}{2}-LSB)$ can be realized by simply incrementing NDIV_INT by one and setting the fractional component to $-\tfrac{1}{2}$. Likewise, a fractional value one LSB less than $(-\tfrac{1}{2})$ can be realized by decrementing NDIV_INT by one and setting the fractional component to $(+\tfrac{1}{2}-LSB)$. A seamless range of fractional divide values can be realized for arbitrary values of NDIV_INT in this manner.

A static value of ±4 creates a sub-integer divide value of ±½ for the case of K=8, so q(n) must be able to take of values of at least [−4, +4] inclusive to satisfy the seamless programming range described above. However, a well-known general problem of scrambling modulators is that, when programming a scrambling sequence q(n) towards the extreme of the modulator's range, the modulator will produce long runs of unchanging values disrupted periodically by a change in value. For example, if a general modulator in the prior art exhibits range of [−4, +4] inclusive, but is programmed to generate a sequence q(n) whose time-average value is 3.99, q(n) will exhibit a steady run of symbols of value +4, interrupted very infrequently by a change to value +3. That is, the DSM generates 99 consecutive values of +4, and one value of +3, and is thereafter unendingly repeated. While preserving the time-average value, the pattern of the sequence q(n) introduces an undesired low-frequency spectral contamination to the PLL output clock that remains unfiltered by the PLL loop itself (due to its low-frequency power). To circumvent this problem, in embodiments of the present invention the range of q(n) is extended by ±1 so that fractional values close to the limits of the range can be realized by frequent dithering between the closest integer value plus [−1, 0, +1] inclusive. Following the above example, if the modulator's range was extended so that q(n) can take on values [−5, +5] inclusive, a time-average value of 3.99 would be realized by frequent dithering of q(n), the output of the modulator or DSM 280, between +3, +4, and +5, as opposed to the prior art using infrequent dithering between +4 and +3.

Consequently, the DSM 280 of this invention will exhibit quantizer levels such that, for the case K=8, q(n) can take on values [−5, +5] inclusive. In one embodiment, for a VCO with K phases, the quantizer of the DSM must be designed to allow q(n) to take on K+3 possible values in the range [−(K/2+1), +(K/2+1)].

Similar to prior-art implementation, the DSM 280 of embodiments of this invention scrambles the value of q(n) such that phase error power is weighted away from low frequencies to high frequencies. This allows for a reduction of overall spur power. A key distinction over the prior art PLLs 100A and 100B is that the magnitude of phase error originally produced is irrespective of how the DSM shapes the spectral distribution of power.

FIG. 7 depicts a DSM 280 used in a PLL configured for phase-dithered fractional-N generation, in accordance with one embodiment of the present disclosure. As shown in FIG. 7, for the case of K=8, the DSM 280 has been outfitted with an 11-level quantizer 710 that can produce q(n) ranging from [−5, +5] inclusive. The number of levels designed for the DSM 280 is dependent on the number of phases (K) in the VCO that is supported. In particular, the DSM 280 receives an M-bit fractional control word, NDIV_FRAC. This value is signed, meaning, it takes on values $[-2^{M-1}, +2^{M-1}-1]$ inclusive. Because the fractional divide-by-N component is defined by NDIV_FRAC/$2^M$, it is clear that Neff is defined by the range NDIV_INT+$[-½, +½-½^M]$ inclusive. As such, q(n) only needs to take on values $[-(K/2+1), +(K/2+1)]$ inclusive. For the case of K=8, the range of q(n) is $[-5, +5]$ inclusive. While sub-integer operation can support values of s(n)=$[-(K-1), +(K-1)]$ inclusive, some of these sub-integer frequency values are redundant and can be aliased by changing the value of NDIV_INT and SUBINT.

A key advantage of the invention over PLL 100B is the ability to create both positive and negative fractional divide values. PLL 100B is only able to rotate in the positive direction. On the other hand, embodiments of the present invention are able to provide bi-directional rotation. This is particularly important when the fractional divide value is programmed to a value very close to zero. As explained above, the DSM 280 will be required to produce a q(n) that dithers between values of −1, 0, and +1 in order to generate fractional values contained in the range (−1/(2K), +1/(2K)), not inclusive. (Similarly for rotation in the same direction, producing a value that is larger than +1/(2K), the modulator or DSM 280 produces a q(n) that dithers between 0, +1 and +2; and similarly, generating a value that is less than −1/(2K), the modulator or DSM 280 produces a q(n) that dithers between 0, −1, and −2). Physically, this means that the rotator unit is configured to reverse the direction of rotation of phase selection each time q(n) changes sign, in one embodiment. The restriction of clock-wise only rotation in the implementation of PLL 100B means that, the modulator can only take on values q(n)=[0, +1] inclusive, which introduces the undesired low-frequency contamination mentioned above.

FIG. 9 is a flow diagram illustrating a method for fractional-N generation in a PLL configured for quantization-free sub-integer generation and/or phase-dithered fractional-N generation, in accordance with one embodiment of the present disclosure. The method provided in flow diagram 900 is implemented in hardware, software, or a combination of hardware and software in embodiments of the present invention.

At 910, the method includes receiving a plurality of phases of the VCO clock that is generated by a ring oscillator. The ring oscillator includes time delay elements generating multiple phases of the VCO clock. In one embodiment, the ring oscillator is configured to create any number of phases, "K".

At 920, the method includes sampling a divided clock generated by a divide-by-N unit with the plurality of phases (e.g., PH[1:8]) to generate a plurality of phase shifted divide-by-N clocks, MUX[1:8].

At 930, the method includes selectively rotating through the plurality of phase shifted divide-by-N clocks. Selective rotation is performed to achieve either quantization-free fractional-N generation or phase-dithered fractional-N generation. For the quantization-free sub-integer fractional-N mode of operation, the selection for rotating is made based on a constant phase shift interval, such that the rate of change of phase of the feedback clock is constant, as is previously described. For the phase-dithered fractional-N mode of operation, selective rotation between phases is based on a dynamically adjusted rate of phase rotation, as dictated by a DSM. That is, the selection for rotating is performed by scrambling a phase rotation through the plurality of phase shifted divided clocks to induce the dynamically-adjusted rate of phase rotation.

At 940, the method includes generating a feedback clock comprising a plurality of selectively rotated phase shifted divide-by-N clocks as selected by said rotator unit. For quantization-free fractional-N generation, the rate of change of phase of the feedback clock remains constant to realize zero instantaneous phase error during PLL tracking, and hence zero fractional-N spur content. For phase-dithered fractional-N generation, the controlled and dithered selection of multiple phases of a divide-by-N clock reduces the power of quantization or phase noise and produces finer resolution of frequency offset generation.

Embodiments of the present invention provide for a general class of PLLs, as opposed to a specific application of PLLs (e.g., those directed to RF applications), wherein the general class of integer-N PLLs includes four common components, such as, the phase detector, charge pump, VCO, loop filter. A general purpose fractional N PLL employs a simple, binary counter style divider as a single isolated unit, as is used in embodiments of the present invention. On the other hand, PRIOR ART PLL 100B implements the feedback divider as a prescale divider, which has prescale unit, plus a binary counter style divider, accompanied by an added divide value with a supplemental binary counter divider.

Accordingly, embodiments of the present invention disclose methods and systems for multiple phase generation and phase rotation induced fractional-N divide generation for a broad or general class of PLLs. Further, other embodiments of the present invention provide for seamless rotation of the fractional-N divide values without any extension control values.

Thus, according to embodiments of the present disclosure, systems and methods are described providing for quantization-free sub-integer fractional-N generation, and phase-dithered fractional-N generation in a PLL.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples in that many architectural variants can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed:

1. A phase locked loop system, comprising:
a retimer unit configured for sampling a divided clock generated by a divide-by-N unit with a plurality of phases of an oscillator clock generated by a ring oscillator to generate a plurality of phase shifted divide-by-N clocks; and
a rotator unit configured for selectively rotating through said plurality of phase shifted divide-by-N clocks based on a constant phase shift interval, wherein said rotator unit controls a clock selection unit to produce a single output phase selected from said plurality of phase shifted divide-by-N clocks.

2. The PLL of claim 1, wherein said constant phase shift interval comprises a positive number for a positive rotation through said plurality of phase shifted divide-by-N clocks.

3. The PLL of claim 1, wherein said constant phase shift interval comprises a negative number for a negative rotation through said plurality of phase shifted divide-by-N clocks.

4. The PLL of claim 1, wherein said divide-by-N unit generates said divided clock by dividing a first phase of said oscillator clock by an integer value.

5. The PLL of claim 4, wherein said rotator unit comprises an overflow unit configured for adjusting said integer value by one for one update cycle of a feedback clock at a roll-over in a positive rotation of said plurality of phase shifted divide-by-N clocks.

6. The PLL of claim 4, wherein said rotator unit comprises an overflow unit configured for adjusting said integer value by negative one for one update cycle of a feedback clock at a roll-under in a negative rotation of said plurality of phase shifted divide-by-N clocks.

7. The PLL of claim 1, wherein a first half of said plurality of phase shifted divide-by-N clocks is generated by said divided clock and a second half of said plurality of phase shifted divide-by-N clocks is generated by a derivative of said divided clock comprising a first phase shifted divide-by-N clock.

8. The PLL of claim 1, wherein said rotator unit generates a static rate of change of phase selection.

9. A phase locked loop system, comprising:
a retimer unit configured for sampling a divided clock generated by a divide-by-N unit with a plurality of phases of an oscillator clock generated by a ring oscillator to generate a plurality of phase shifted divide-by-N clocks;
a delta sigma modulator (DSM) coupled to a rotator unit and configured for generating a time varying sequence of control values; and
said rotator unit coupled to said DSM configured for controlling a clock selection unit to produce a single output phase selected from said plurality of phase shifted divide-by-N clocks, wherein said rotator unit is dynamically programmed by said time varying sequence of control values, and wherein the rate of rotation through said plurality of phase shifted divide-by-N clocks is dithered.

10. The PLL of claim 9, wherein a defined phase shift interval comprises at least one of a positive number for a positive rotation through said plurality of phase shifted divide-by-N clocks, and a negative number for a negative rotation through said plurality of phase shifted divide-by-N clocks.

11. The PLL of claim 9, wherein a rotation through said plurality of phase shifted divide-by-N clocks comprises a bi-directional rotation.

12. The PLL of claim 9, wherein said divide-by-N unit generates said divided clock by dividing a first phase of said oscillator clock by an integer value.

13. The PLL of claim 12, wherein said rotator unit comprises an overflow unit configured for adjusting said integer value by one for one update cycle of a feedback clock at a roll-over in a positive rotation of said plurality of phase shifted divide-by-N clocks.

14. The PLL of claim 12, wherein said rotator unit comprises an overflow unit configured for adjusting said integer value by negative one for one update cycle of a feedback clock at a roll-under in a negative rotation of said plurality of phase shifted divide-by-N clocks.

15. The PLL of claim 9, wherein said DSM comprises a specific number of quantizer levels that is based on the number of phases of said oscillator clock.

16. The PLL of claim 9, wherein said rotator unit produces a time varying rate of change of phase selection.

17. A method for performing phase locking in a phase locked loop system, comprising:
receiving a plurality of phases of an oscillator clock generated by a ring oscillator;
sampling a divided clock generated by a divide-by-N unit with said plurality of phases to generate a plurality of phase shifted divide-by-N clocks; and
generating a single clock by rotated selection of said plurality of phase-shifted divide-by-N clocks by a rotator unit.

18. The method of claim 17, wherein said generating a single clock further comprises:
selectively rotating based on a constant phase shift interval such that rate of change of phase of a feedback clock is constant.

19. The method of claim 17, wherein said generating a single clock further comprises:
selectively rotating based on a dynamically-adjusted rate of phase rotation; and
scrambling a phase rotation through said plurality of phase shifted divide-by-N clocks to induce said dynamically-adjusted rate of phase rotation.

20. The method of claim 17, further comprising:
generating said divided clock by dividing a first phase of said oscillator clock by an integer value;
adjusting said integer value by one for one update cycle of a feedback clock at a roll-over in a positive rotation of said plurality of phase shifted divide-by-N clocks; and
adjusting said integer value by negative one for one update cycle of said feedback clock at a roll-under in a negative rotation of said plurality of phase shifted divide-by-N clocks.

* * * * *